United States Patent
Chan et al.

(10) Patent No.: US 11,043,386 B2
(45) Date of Patent: Jun. 22, 2021

(54) ENHANCED SPATIAL ALD OF METALS THROUGH CONTROLLED PRECURSOR MIXING

(71) Applicant: Applied Materials, Inc., Santa Clara, CA (US)

(72) Inventors: Kelvin Chan, San Ramon, CA (US); Yihong Chen, San Jose, CA (US); Jared Ahmad Lee, San Jose, CA (US); Kevin Griffin, Livermore, CA (US); Srinivas Gandikota, Santa Clara, CA (US); Joseph Yudovsky, Campbell, CA (US); Mandyam Sriram, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 362 days.

(21) Appl. No.: 15/959,972

(22) Filed: Apr. 23, 2018

(65) Prior Publication Data

US 2018/0240676 A1   Aug. 23, 2018

Related U.S. Application Data

(63) Continuation-in-part of application No. 15/494,892, filed on Apr. 24, 2017, now abandoned, and a
(Continued)

(51) Int. Cl.
*H01L 21/285* (2006.01)
*H01L 21/3205* (2006.01)
(Continued)

(52) U.S. Cl.
CPC ........ *H01L 21/28562* (2013.01); *C23C 16/06* (2013.01); *C23C 16/14* (2013.01);
(Continued)

(58) Field of Classification Search
CPC .................... C23C 16/50; C23C 16/45527
See application file for complete search history.

(56) References Cited

U.S. PATENT DOCUMENTS

| | | | |
|---|---|---|---|
| 4,391,846 A | 7/1983 | Raymond | |
| 4,699,801 A | 10/1987 | Ito et al. | |

(Continued)

FOREIGN PATENT DOCUMENTS

| | | |
|---|---|---|
| CN | 1403627 A | 3/2003 |
| CN | 101308794 A | 11/2008 |

(Continued)

OTHER PUBLICATIONS

Final Office Action in U.S. Appl. No. 15/461,842 dated Sep. 12, 2019, 7 pages.

(Continued)

*Primary Examiner* — Kelly M Gambetta
(74) *Attorney, Agent, or Firm* — Servilla Whitney LLC

(57) ABSTRACT

Methods of depositing a film by atomic layer deposition are described. The methods comprise exposing a substrate surface to a first process condition comprising a first reactive gas and a second reactive gas and exposing the substrate surface to a second process condition comprising the second reactive gas. The first process condition comprises less than a full amount of the second reactive gas for a CVD process.

19 Claims, 5 Drawing Sheets

Related U.S. Application Data continuation-in-part of application No. 15/461,842, filed on Mar. 17, 217, which is a continuation of application No. 14/965,349, filed on Dec. 10, 2015, now Pat. No. 9,601,339, which is a continuation of application No. 14/062,804, filed on Oct. 24, 2013, now Pat. No. 9,230,815.

(60) Provisional application No. 61/719,350, filed on Oct. 26, 2012, provisional application No. 61/784,281, filed on Mar. 14, 2013, provisional application No. 61/825,983, filed on May 21, 2013, provisional application No. 62/327,091, filed on Apr. 25, 2016.

(51) Int. Cl.

| | | |
|---|---|---|
| *C23C 16/06* | (2006.01) | |
| *C23C 16/455* | (2006.01) | |
| *H01L 21/28* | (2006.01) | |
| *C23C 16/14* | (2006.01) | |
| *C23C 16/452* | (2006.01) | |
| *C23C 16/458* | (2006.01) | |
| *H01L 21/768* | (2006.01) | |

(52) U.S. Cl.
CPC ........ *C23C 16/452* (2013.01); *C23C 16/4557* (2013.01); *C23C 16/4584* (2013.01); *C23C 16/45525* (2013.01); *C23C 16/45534* (2013.01); *C23C 16/45551* (2013.01); *C23C 16/45563* (2013.01); *C23C 16/45565* (2013.01); *C23C 16/45574* (2013.01); *H01L 21/28079* (2013.01); *H01L 21/28088* (2013.01); *H01L 21/28506* (2013.01); *H01L 21/32051* (2013.01); *H01L 21/76877* (2013.01)

(56) References Cited

U.S. PATENT DOCUMENTS

| | | | |
|---|---|---|---|
| 5,112,439 A * | 5/1992 | Reisman | ............ C23C 16/04 117/102 |
| 5,747,113 A | 5/1998 | Tsai | |
| 6,162,715 A | 12/2000 | Mak et al. | |
| 6,242,045 B1 | 6/2001 | Proscia et al. | |
| 6,875,271 B2 | 4/2005 | Glenn et al. | |
| 7,674,710 B2 | 3/2010 | Ashigaki et al. | |
| 7,745,333 B2 | 6/2010 | Lai et al. | |
| 8,043,432 B2 | 10/2011 | Dip | |
| 2001/0007244 A1 | 7/2001 | Matsuse | |
| 2002/0197856 A1 | 12/2002 | Matsuse et al. | |
| 2003/0041804 A1 | 3/2003 | Shim et al. | |
| 2003/0190804 A1* | 10/2003 | Glenn | ............ C23C 16/45508 438/689 |
| 2003/0215990 A1 | 11/2003 | Fitzgerald et al. | |
| 2004/0065255 A1* | 4/2004 | Yang | ............ C23C 16/45551 118/715 |
| 2004/0067641 A1 | 4/2004 | Yudovsky | |
| 2004/0214416 A1 | 10/2004 | Woo et al. | |
| 2006/0014355 A1 | 1/2006 | Park et al. | |
| 2006/0024959 A1 | 2/2006 | Li et al. | |
| 2007/0148350 A1 | 6/2007 | Rahtu et al. | |
| 2009/0035941 A1 | 2/2009 | Park et al. | |
| 2009/0053893 A1 | 2/2009 | Khandelwal et al. | |
| 2009/0200672 A1 | 8/2009 | Kim et al. | |
| 2010/0062614 A1 | 3/2010 | Ma et al. | |
| 2010/0075037 A1 | 3/2010 | Marsh et al. | |
| 2010/0102417 A1 | 4/2010 | Ganguli et al. | |
| 2010/0184294 A1 | 7/2010 | Park et al. | |
| 2011/0159702 A1 | 6/2011 | Ohizumi et al. | |
| 2012/0003833 A1 | 1/2012 | Khandelwal et al. | |
| 2012/0244699 A1 | 9/2012 | Khandelwal et al. | |
| 2013/0164445 A1 | 6/2013 | Kwong et al. | |
| 2014/0120723 A1* | 5/2014 | Fu | ............ C23C 16/4557 438/680 |
| 2015/0194298 A1 | 7/2015 | Lei et al. | |
| 2016/0108524 A1 | 4/2016 | Dickey et al. | |

FOREIGN PATENT DOCUMENTS

| | | |
|---|---|---|
| CN | 102197459 A | 9/2011 |
| JP | S58181714 A | 10/1983 |
| JP | 2008-131050 A | 6/2008 |
| KR | 100551073 B1 | 2/2006 |
| KR | 100831974 B1 | 5/2008 |
| KR | 10-2009-0013286 A | 2/2009 |
| KR | 10-2010-0084207 A | 7/2010 |
| TW | 200503264 A | 1/2005 |
| TW | 200710968 A | 3/2007 |
| WO | 2008/100846 A2 | 8/2008 |
| WO | 2010062582 A2 | 6/2010 |
| WO | 2014066792 A1 | 5/2014 |

OTHER PUBLICATIONS

PCT International Preliminary Report on Patentability in PCT/US2013/066866, dated May 7, 2015, 14 pages.
PCT International Search Report and Written Opinion in PCT/US2013/066866, dated Feb. 25, 2014, 17 pages.
PCT International Search Report and Written Opinion in PCT/US2017/029085 dated Jul. 13, 2017, 12 pages.
Non-Final Office Action in U.S. Appl. No. 15/461,842 dated Aug. 9, 2018, 6 pages.
Non-Final Office Action in U.S. Appl. No. 15/461,842 dated Mar. 8, 2019, 7 pages.

\* cited by examiner

ENHANCED SPATIAL ALD OF METALS THROUGH CONTROLLED PRECURSOR MIXING

CROSS-REFERENCE TO RELATED APPLICATIONS

This application is a continuation-in-part of U.S. patent application Ser. No. 15/461,842, filed Mar. 17, 2017, which is continuation of U.S. patent application Ser. No. 14/965,349, filed Dec. 10, 2015, which is a continuation of U.S. patent application Ser. No. 14/062,804, filed Oct. 24, 2013, now U.S. Pat. No. 9,230,815, issued Jan. 5, 2016, which claims priority to U.S. Provisional Application Nos. 61/719,350, filed Oct. 26, 2012, 61/784,281, filed Mar. 14, 2013 and 61/825,983, filed May 21, 2013, and a continuation-in-part of U.S. patent application Ser. No. 15/494,892, filed Apr. 24, 2017, which claims priority to United States Provisional Application No. 62/327,091, filed Apr. 25, 2016, the entire disclosure of which is hereby incorporated by reference herein.

TECHNICAL FIELD

The present disclosure relates generally to apparatus and methods of depositing thin films. In particular, the disclosure relates to apparatus and methods for depositing spatial ALD films with controlled precursor mixing.

BACKGROUND

Spatial ALD relies on spatial separation of precursors. Film growth happens when a substrate moves from one precursor zone to another. As the substrate repeatedly moves between the two zones, continual growth is realized. One example is tungsten spatial ALD in which one precursor zone is filled with $WF_6$ and another precursor zone is filled with $H_2$. In each zone, the precursor may or may not be diluted with argon. One exposure cycle means the substrate having travelled through one $WF_6$ zone and one $H_2$ zone.

Growth rates are typically below 0.2 angstroms/cycle for the spatial ALD of tungsten at substrate temperatures between 200 and 450 degrees Celsius. There is a need in the art for methods of depositing films by spatial ALD with greater growth rates.

SUMMARY

One or more embodiments of the disclosure are directed to methods of depositing a film by atomic layer deposition. The methods comprise exposing a substrate surface to a first process condition comprising a first reactive gas and a second reactive gas and exposing the substrate surface to a second process condition comprising the second reactive gas. The first process condition comprises less than a full amount of the second reactive gas for a CVD process.

Additional embodiments of the disclosure are directed to methods comprising exposing a substrate surface to a first process condition comprising a first reactive gas and a second reactive gas. The first reactive gas and the second reactive gas being spontaneously reactive. The substrate surface is exposed to a second process condition consisting essentially of the second reactive gas. The first process condition comprises less than a full amount of the second reactive gas for CVD.

Further embodiments of the disclosure are directed to methods comprising exposing a substrate surface to a first process condition in a first process region of a processing chamber. The first process condition comprises a constant flow of a first reactive gas comprising $WF_6$ and a pulsed flow of a second reactive gas consisting essentially of $H_2$. The second reactive gas pulsed so that there is less than a full amount of the second reactive gas for CVD. The substrate is laterally moved through a gas curtain from the first process region to a second process region of the processing chamber. The gas curtain comprising one or more of a purge gas stream and/or a vacuum region. The substrate surface is exposed to a second process condition in the second process region. The second process condition consisting essentially of $H_2$. The substrate is laterally moved through a gas curtain from the second process region. The gas curtain comprises one or more of a purge gas stream and/or a vacuum region. Exposures to the first process condition and the second process condition are repeated to deposit a film of a predetermined thickness.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Some embodiments of the disclosure are directed to processes that use a reaction chamber with multiple gas ports that can be used for introduction of different chemicals or plasma gases. Spatially, these gas ports (also referred to as channels) are separated by inert purging gases and/or vacuum pumping holes to create a gas curtain that minimizes or eliminates mixing of gases from different gas ports to avoid unwanted gas phase reactions. Wafers moving through these different spatially separated ports get sequential and multiple surface exposures to different chemical or plasma environment so that layer by layer film growth in spatial ALD mode or surface etching process occur. In some embodiments, the processing chamber has modular architectures on gas distribution components and each modular component has independent parameter control (e.g., RF or gas flow) to provide flexibility to control, for example, gas flow and/or RF exposure.

Figure 1:
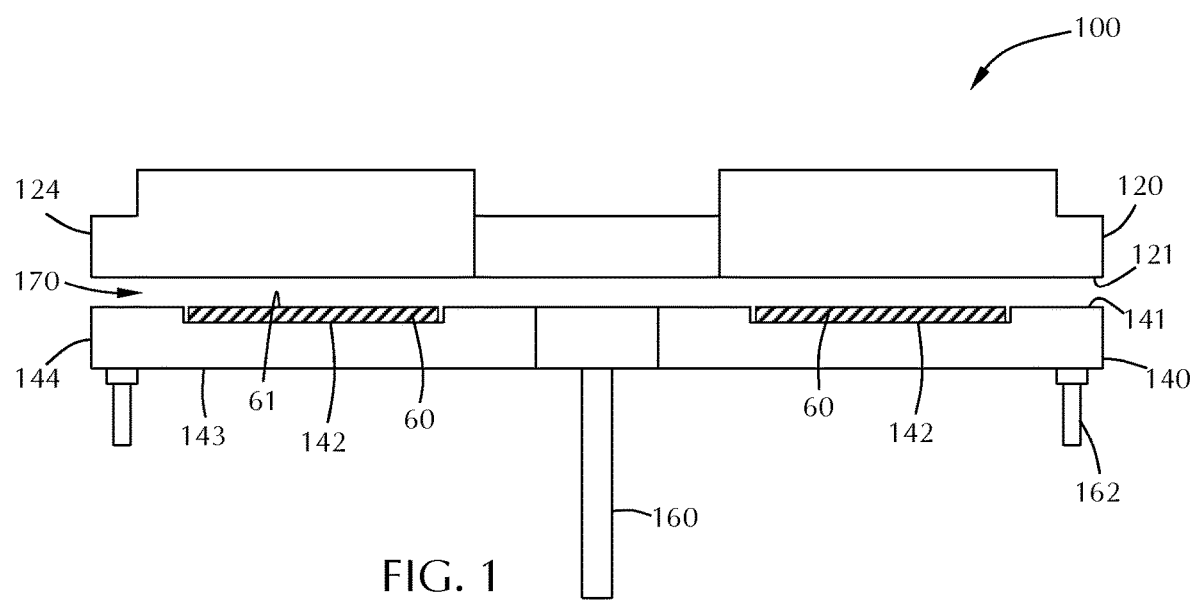
FIG. 1 shows a cross-sectional view of a batch processing chamber in accordance with one or more embodiment of the disclosure.

Embodiments of the disclosure are directed to apparatus and methods to provide enhanced chemical exchange in a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
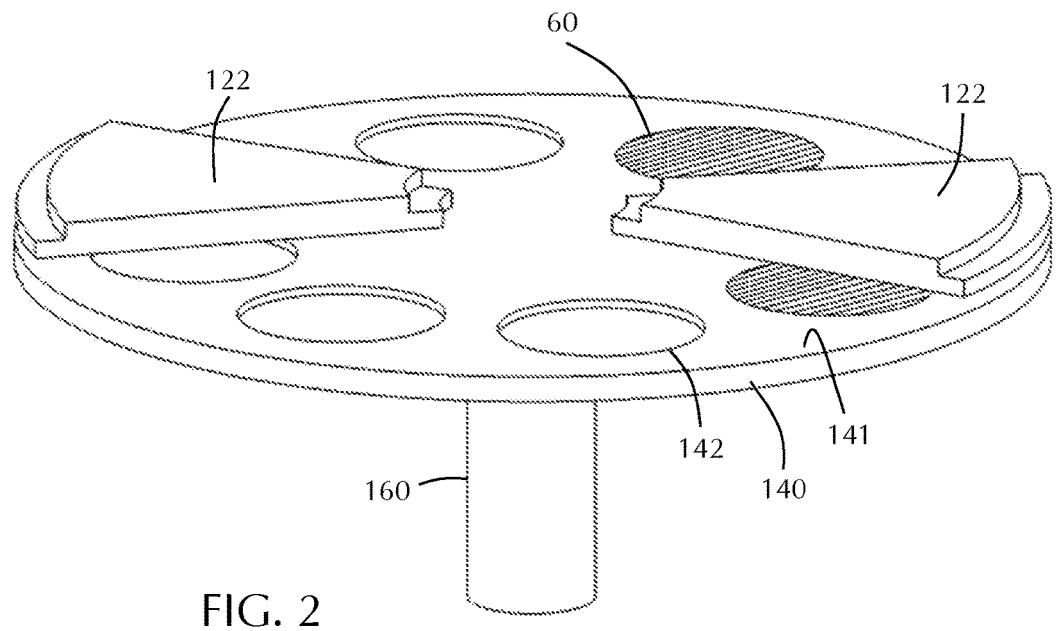
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.5 mm. In some embodiments, the top surfaces are coplanar within ±0.4 mm, ±0.3 mm, ±0.2 mm, ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
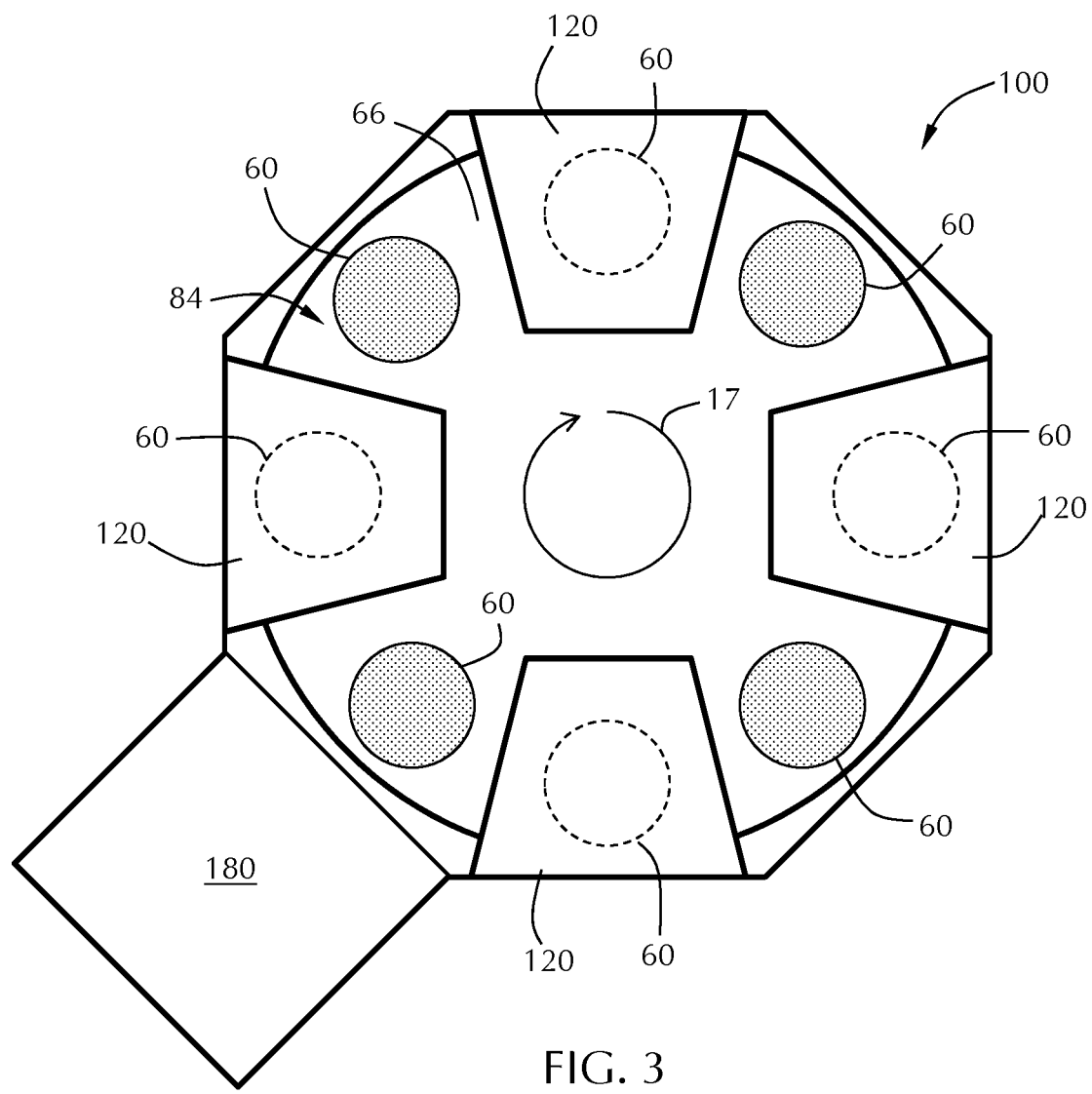
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the gas distribution assemblies 120. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the gas distribution assemblies 120. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called gas distribution assemblies 120) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
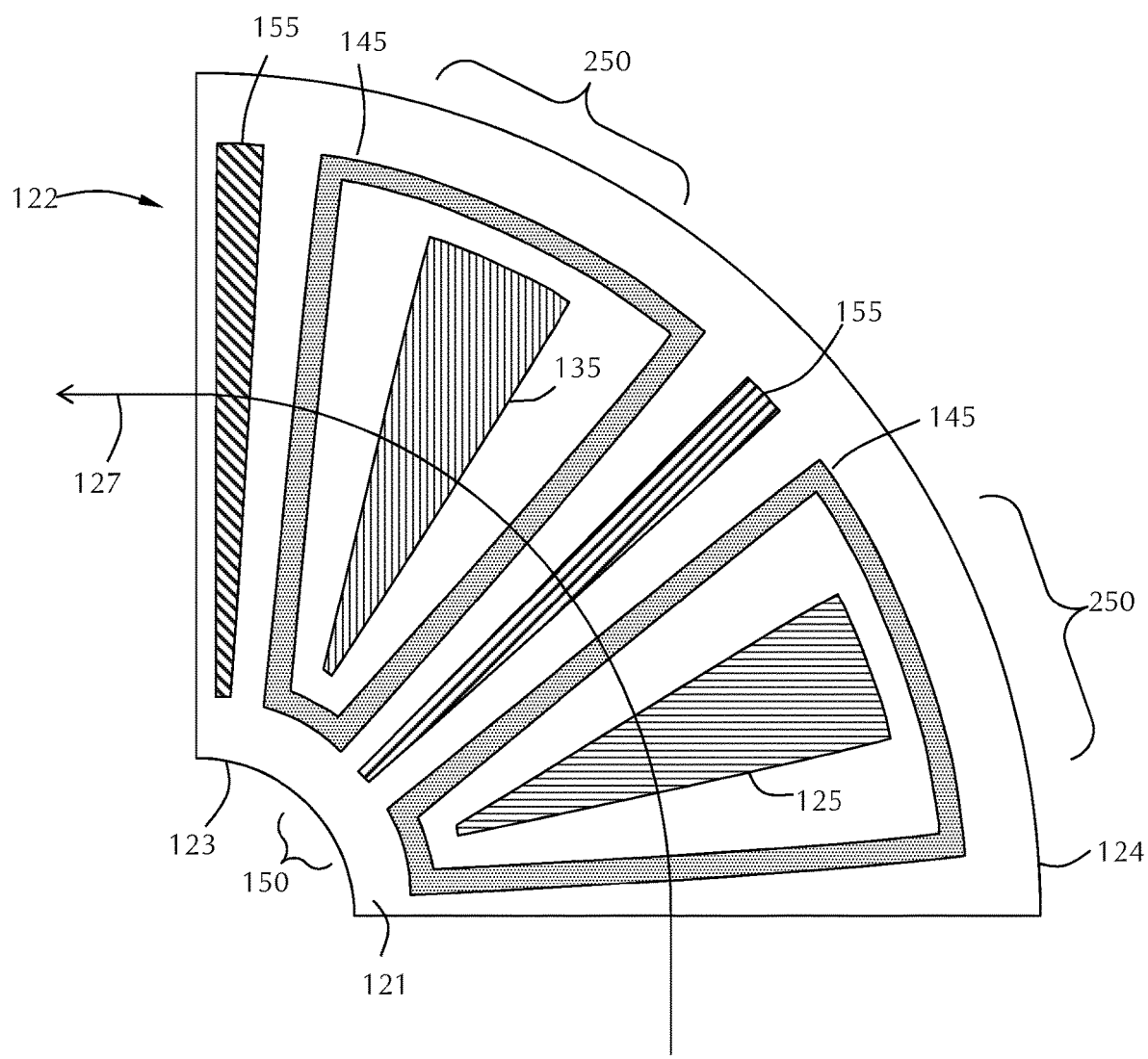
FIG. 4 shows a schematic view of a portion of a wedge shaped gas distribution assembly for use in a batch processing chamber in accordance with one or more embodiment of the disclosure.
Figure 5:
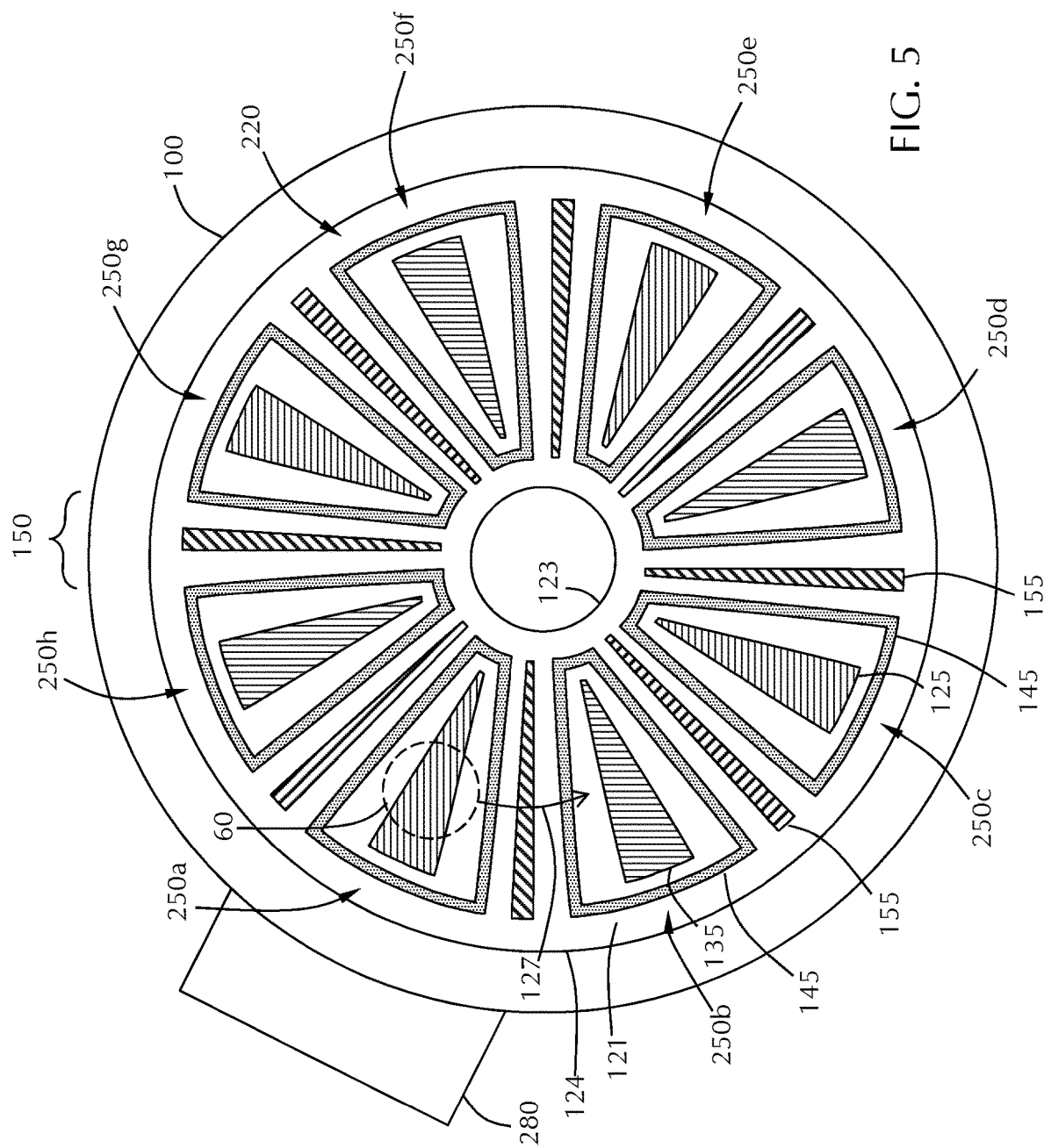
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas 125 and the second reactive gas 135 to form a layer. The injector unit 122 shown makes a quarter circle but could be larger or smaller. The gas distribution assembly 220 shown in FIG. 5 can be considered a combination of four of the injector units 122 of FIG. 4 connected in series. The path 127 shown in FIG. 4 is represented as counter-clockwise; however, those skilled in the art will understand that the path can be reversed and/or the order of gas ports can be reversed.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process region. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h. The number of gas curtains is generally equal to or greater than the number of process regions.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

A first reactive gas A is flowed into one or more of the process regions 250 while an inert gas is flowed into any process region 250 which does not have a first reactive gas A flowing into it. For example if the first reactive gas is flowing into process regions 250b through process region 250h, an inert gas would be flowing into process region 250a. The inert gas can be flowed through the first reactive gas port 125 or the second gas port 135.

The inert gas flow within the process regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the process regions easier by decreasing the differences in pressure between adjacent regions.

Accordingly, one or more embodiments of the disclosure are directed to processing methods utilizing a batch processing chamber like that shown in FIG. 5. A substrate 60 is placed into the processing chamber which has a plurality of sections 250, each section separated from adjacent section by a gas curtain 150.

In some embodiments, a substrate surface is exposed to a first process condition followed by exposure to a second process condition. As used in this manner, the term "process condition" refers to the chemical environment, temperature and pressure. The first process condition comprises a first reactive gas and a second reactive gas. The first reactive gas and the second reactive gas are spontaneously reactive under the process conditions (e.g., temperature and pressure). The second reactive gas is provided in an amount that is less than a full amount that would be used for a chemical vapor deposition (CVD) process.

In a time-domain process, the after exposure to the first process condition, the processing chamber is purged to replace the first process condition with an inert environment. This also removes by-products from the reaction of the first reactive gas and the second reactive gas. In a spatial ALD process, like one that uses a chamber shown in FIG. 5, after exposure to the first process condition, the substrate can be laterally moved through a gas curtain to a second process region of the processing chamber. The gas curtain locally purges the first process condition from the substrate surface to replace the first process condition existing in the first process region. The gas curtain comprises one or more of a purge gas stream and/or a vacuum region. In some embodiments, as shown in FIG. 5, the gas curtain comprises a purge gas stream bounded on either side by a vacuum region so that the substrate surface is exposed to, in order, a vacuum region, a purge gas stream and a second vacuum region between each of the process regions of the processing chamber.

After exposure to the first process condition and purging the substrate surface is exposed to a second process condition. The second process condition can be formed in the process chamber (time-domain ALD) or in a second process region of the processing chamber (spatial ALD). The second process condition comprises the second reactive gas. In some embodiments, the second process condition consists essentially of the second reactive gas. As used in this regard, the term "consists essentially of" means that the reactive species of the second reactive gas makes up greater than or equal to about 95%, 98% or 99% of the stated species on a molar basis. The percentage does not include inert gases, diluent gases or carrier gases.

After exposure to the second reactive gas, the substrate surface or processing chamber is purged of the second process condition. This can be performed by purging the entire process chamber (i.e., in a time-domain process) or moving the substrate through a gas curtain to a different region of the processing chamber (i.e., in a spatial process).

Some embodiments of the disclosure enhance the growth rates by bleeding $H_2$ into the $WF_6$ zone in a controlled manner (first process condition). In this enhanced spatial ALD, the $H_2$ zone remains the same, having only $H_2$ and in some cases argon as well (second process condition). The $WF_6$ zone now has both $WF_6$ and $H_2$. In some embodiments, argon is present as well.

Growth rates (also called deposition rates) of greater than 0.2 Å/cycle may be realized. In an effort to enhance growth rate to beyond 0.2 Å/cycle while maintaining step coverage, a controlled amount of $H_2$ or an $H_2$/inert mixture is introduced into the $WF_6$ zone(s) as well. This is referred to as enhanced spatial ALD. In some embodiments, the deposition rate is in the range of about 0.2 Å/cycle to about 1 Å/cycle.

In some embodiments, the first process condition comprises $WF_6$. The first process condition of some embodiments comprises $WF_6$, $H_2$, and an optional inert gas such as argon. In some embodiments, the second process condition comprises $H_2$ and an optional inert gas such as argon.

In an exemplary embodiment, the first process condition comprises $WF_6$ with a total flow rate in the range of about 10 to about 1000 sccm, or in the range of about 50 to about 500 sccm, or about 100 sccm. The $H_2$ flow of the first process condition is in the range of about 1 to about 100 sccm, or about 10 sccm. The argon flow of the first process condition is in the range of about 0 to about 10000 sccm, or in the range of about 100 to about 5000 sccm, or in the range of about 500 to about 1000 sccm, or about 890 sccm.

In some embodiments, the second process condition comprises or consists essentially of a mixture of $H_2$/Ar. The percentage of $H_2$ in the mixture can be in the range of about 1 to about 99%, or in the range of about 1 to about 80%, or in the range of about 1 to about 60%, or in the range of about 2 to about 40%, or in the range of about 3 to about 20%, or in the range of about 3 to about 10%, or about 4%.

The total $H_2$/Ar mixture flow can be in the range of about 1 to about 10000 sccm, or in the range of about 10 to about 1000 sccm, or in the range of about 100 to about 500 sccm, or in about 250 sccm. The total $H_2$ flow can be in the range of about 1 to about 10000 sccm, or in the range of about 100 to about 5000 sccm, or in the range of about 1000 to about 4000 sccm, or about 2000 sccm. The total amount of argon flow can be in the range of about 0 to about 10000 sccm. If no argon co-flow is used, the flow is 0 sccm.

The substrate temperature can be adjusted and maintained based on the precursors being used. In some embodiments, the temperature of the substrate is in the range of about 200° C. to about 700° C., or in the range of about 300° C. to about 500° C., or in the range of about 325° C. to about 400° C., or about 350° C.

Suitable tungsten precursors for use with the first process condition include, but are not limited, to $WF_6$, $WCl_6$, $WCl_5$, $WOCl_4$, $W_2Cl_{10}$, $WCl_4$, bis(cyclopentadienyl)tungsten(IV) chloride hydride and/or combinations thereof. Suitable molybdenum precursors for use with the first process condition include, but are not limited to, $MoF_6$, $MoCl_5$, $MoOCl_4$, $MoCl_3$ and/or combinations thereof.

Exposure to the first process condition and the second process condition can be repeated to deposit a film having a predetermined thickness. In a time-domain process, the processing chamber is purged between each process condition exposure. In a spatial process, the substrate is moved among different process regions of the processing chamber where different process regions have different process conditions. For example, referring to FIG. 5, process regions 250a, 250c, 250e and 250g may have the first process condition and process regions 250b, 250d, 250f and 250h may have the second process condition. A substrate rotated through a complete circle would be exposed to four repeated sequences of the first process condition and the second process condition.

In some embodiments, the film deposited is a tungsten-containing layer. In some embodiments, the film deposited is a molybdenum containing layer. An exemplary process is described herein as it relates to forming a tungsten-containing layer. One skilled in the art will recognize that the exemplary method described herein may be adapted to the deposition of other films.

Figure 6:
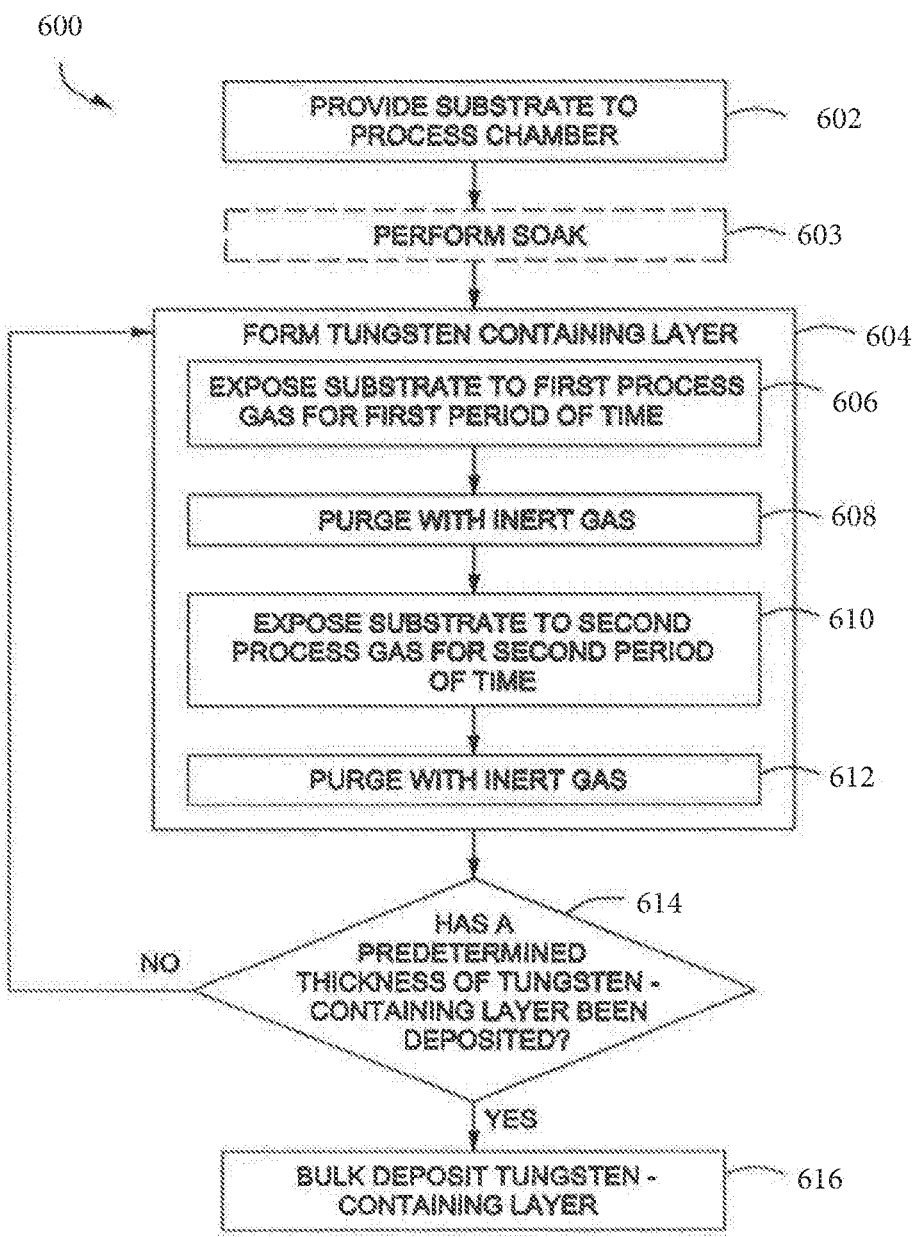
FIG. 6 illustrates an exemplary process sequence for the formation of a tungsten layer using a two pulse cyclical deposition technique according to one embodiment described herein.

FIG. 6 depicts a method for forming a tungsten-containing layer on a substrate in accordance with some embodiments of the invention. The method 600 generally begins at 602, where a substrate, having a surface upon which a tungsten-containing layer is to be formed is provided and placed into a processing chamber. As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the tungsten-containing layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the tungsten-containing layer may be at least partially formed thereon. For example, in some embodiments, a layer comprising a metal, a nitride, an oxide, or the like, or combinations thereof may be disposed on the substrate and may have the tungsten containing layer formed upon such layer or layers.

In some embodiments, the substrate may be exposed to an optional soak process 603 prior to beginning the cyclical deposition process to form a tungsten-containing layer on the substrate (as discussed below at 604), as shown in phantom at 603. In one or more embodiments, the method 604 of depositing the tungsten-containing layer on the substrate does not require a soaking process. This means there is substantially no advantage to soaking prior to depositing the film. As used in this specification and the appended claims, the term "substantially no advantage" used in this respect means that there is less than about a 10% increase in the deposition rate or less than about a 20% difference in the conformality and uniformity of the deposited film. That being said, there are embodiments which are discussed further below in which a presoak forms an important part of the overall process. In some embodiments, the soak process may comprise heating the substrate to a soak temperature followed by exposing the substrate to a soak gas. For example, in some embodiments, the substrate may be heated to a temperature of about 100 to about 600° C., or in some embodiments, about 200° C. to about 600° C., or in some embodiments about 300° C. to about 500° C., or in some embodiments about 350° C. to about 420° C., or in some embodiments about 375° C. to about 500° C.

In some embodiments, the soak gas may comprise a reducing gas comprising a hydrogen gas and/or a hydride compound, such as silane compounds (e.g., silane, disilane, trisilane, tetrasilane, chlorosilane, dichlorosilane, tetrachlorosilane, hexachlorodisilane, methylsilane, or the like), borane compounds (e.g., borane, diborane, triborane, tetraborane, pentaborane, alkylboranes, or the like), phosphine, ammonia, amine compounds, hydrogen, derivatives thereof, combinations thereof, or the like. When present, the reducing gas adsorbs to and/or reacts with the substrate surface, to form a treated surface. In some embodiments, the treated surface provides a quicker deposition process for an overall smooth and more uniform subsequently deposited layers.

In some embodiments, the substrate is subjected to a silane soak. Some of these embodiments use a silane soak that is substantially only silane. As used in this specification and the appended claims, the term "substantially only silane" used in this respect means that the soaking fluid is 99% silane or greater as the soaking agent. For example, a soak solution that is 5% silane in hydrogen, would be considered 100% silane as the diluent (hydrogen) is not included.

In some embodiments, the reducing gas contains a hydrogen/hydride flow rate ratio of about 40:1 or greater, or in some embodiments, about 100:1 or greater, or in some embodiments, about 500:1 or greater, or in some embodiments, about 800:1 or greater, or in some embodiments, about 1,000:1 or greater. In some embodiments, the hydride compound (e.g., diborane) may have a flow rate of about 1 sccm to about 75 sccm, or in some embodiments, about 3 sccm to about 30 sccm, or in some embodiments, about 5 sccm to about 15 sccm. In some embodiments, the hydride compound may be within a carrier gas (e.g., hydrogen, nitrogen, argon, helium or the like), such that the mixture may have a flow rate within a range of about 50 sccm to about 500 sccm, or in some embodiments, about 75 sccm to about 400 sccm, or in some embodiments, about 100 sccm to about 300 sccm. In some embodiments, the hydrogen gas may be provided at a flow rate of about 1 slm to about 20 slm, or in some embodiments, from about 3 slm to about 15 slm, or in some embodiments, from about 5 slm to about 10 slm. The hydrogen/hydride flow rate ratio may be calculated by dividing the total hydrogen flow rate by the total hydride flow rate. The total hydrogen flow rate contains the sum of all sources of hydrogen including the flow rate of any hydrogen carrier gas and the flow rate of any independent hydrogen gas.

In some embodiments, the reducing gas may be mixed within the processing/deposition chamber or outside and may be coming from multiple sources. For example, in some embodiments, the substrate is exposed to the reducing gas which is formed by combining in the chamber a gas flow of a reducing or hydride compound and hydrogen mixture (e.g., 5% $B_2H_6$ in $H_2$) along with a gas flow of hydrogen gas. In another example, in some embodiments, the gas flow of the reducing or hydride compound and hydrogen mixture (e.g., 5% $B_2H_6$ in $H_2$) and the gas flow of hydrogen gas are combined prior to entering the chamber. Additional process parameters may be utilized to facilitate the soak process. For example, in some embodiments, the soak process may be performed while maintaining a pressure in the process chamber of about 1 Torr to about 150 Torr, or in some embodiments, from about 1 Torr to about 100 Torr, or in some embodiments, from about 10 Torr to about 50 Torr, or in some embodiments, from about 20 Torr to about 40 Torr, or in some embodiments, about 5 Torr to about 20 Torr. In some embodiments, the soak process may be performed for a time period within of about 1 second to about 90 seconds, or in some embodiments, less than about 60 seconds, or in some embodiments, less than about 30 seconds, or in some embodiments, less than about 10 seconds.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The process of forming the tungsten-containing layer at step 604 may begin by exposing the substrate to a first reactive gas. In some embodiments, the first reactive gas comprises a tungsten precursor (also referred to as a tungsten-containing gas, and the like) and is exposed to the substrate for a first period of time, as shown at 606. The tungsten precursor can be any suitable tungsten-containing gas including, but not limited to, halide based tungsten precursors or a metal-organic based tungsten precursor. For example, in some embodiments, the tungsten precursor may comprise tungsten pentachloride ($WCl_5$), compounds with the empirical formula of $WCl_5$ (e.g., $W_2Cl_{10}$, $W_3Cl_{15}$), tungsten hexachloride ($WCl_6$), compounds with the empirical formula of $WCl_6$ (e.g., $W_2Cl_{12}$), tungsten hexafluoride ($WF_6$). In one or more embodiments, the tungsten-containing precursor is selected from the group consisting of tungsten pentachloride, compounds with the empirical formula $WCl_5$ and tungsten hexachloride. In some embodiments, the tungsten-containing compound comprises a compound with the empirical formula $W_xCl_{5x}$, where x is greater than or equal to about 1 and y is greater than or equal to about 5. Without being bound by any particular theory of operation, it is believed that changing the anion from fluoride to chloride results in a larger ion which limits diffusion, resulting in a larger conduction. In some embodiments, the tungsten-containing film is substantially carbon free. As used in this specification and the appended claims, the term "substantially carbon free" means that there is less than about 1% or 0.5% or 0.1% carbon on an atomic basis in the film.

The tungsten-containing process gas may be provided in one or more pulses or continuously. The flow rate of the tungsten-containing gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The tungsten-containing precursor can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

In some embodiments, a tungsten nucleation layer is formed as part of the tungsten-containing layer. The tungsten nucleation layer can be formed using the same or different tungsten precursor as used in the tungsten-containing process gas. The period of time that the substrate is exposed to the tungsten-containing gas may be any suitable amount of time necessary to allow the tungsten precursor to form an adequate nucleation layer atop the substrate surfaces. For example, the process gas may be flowed into the process chamber for a period of about 0.1 seconds to about 90 seconds. In some time-domain ALD processes, the tungsten-containing gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec. The nucleation layer is typically deposited to a thickness in a range from about 10 Å to about 200 Å and the bulk layer has a thickness in a range from about 100 Å to about 10,000 Å, preferably in the range from about 1,000 Å to about 5,000 Å. However, the thickness of these films can vary depending on the feature sizes and aspect ratios of a given application.

In some embodiments, an inert gas may additionally be provided to the process chamber at the same time as the tungsten-containing gas. The inert gas may be mixed with the tungsten-containing gas (e.g., as a diluent gas) or separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, combinations thereof, or the like. In one or more embodiments, the tungsten-containing gas is mixed with argon prior to flowing into the process chamber.

The temperature of the substrate during deposition can be controlled, for example, by setting the temperature of the substrate support or susceptor. In some embodiments the substrate is held at a temperature in the range of about 300° C. to about 475° C., or in the range of about 350° C. to about 450° C. In one or more embodiments, the substrate is maintained at a temperature less than about 475° C., or less than about 450° C., or less than about 425° C., or less than about 400° C., or less than about 375° C.

In addition to the foregoing, additional process parameters may be regulated while exposing the substrate to the tungsten-containing process gas. For example, in some embodiments, the process chamber may be maintained at a pressure of about 0.3 to about 90 Torr.

In some embodiments, a low resistivity film (or a tunable grain size film) is deposited using a combination of silane presoaking and ALD W deposition. For example, a substrate is soaked in substantially only silane before any ALD cycles (i.e., in step 603 of FIG. 6). A tungsten-containing precursor is co-flowed with a relatively low amount of hydrogen gas during the tungsten exposure step 606. The amount of hydrogen co-flowed with the tungsten-containing precursor is low enough so that there is substantially no CVD deposition. Relatively low flow of hydrogen is relative to the amount of hydrogen needed for a reduction in step 610, not the amount of tungsten precursor being co-flowed. For example, hydrogen is co-flowed at about 5 sccm (where it is about 2000 times greater for reductions). In some embodiments, the first reactive gas which contains the tungsten-containing compound and hydrogen has more hydrogen than tungsten on an atomic basis. In one or more embodiments, the mixture of tungsten-containing precursor to hydrogen is in the range of about 1:2 to 1:20. The inventors have surprisingly found that a tungsten film deposited with processes using a silane soak and hydrogen co-flow has a higher grain size and a lower resistivity than other processes. A 70 Å tungsten film deposited by a standard process (i.e., no silane presoak and/or no hydrogen co-flow) has a grain size of 33 Å. The grain size for a 70 Å tungsten film using a silane soak and hydrogen co-flow is about 70 Å. In some embodiments, when the thickness of the tungsten film is about 70 Å, the tungsten film has a grain size greater than or equal to about 60 Å or 65 Å. A 200 Å tungsten film deposited by a standard process has a resistivity of about 40 µΩ·cm while a film deposited by the silane soak and hydrogen co-flow process has a resistivity of about 20 µΩ·cm. In some embodiments, when the tungsten film has a thickness of about 200 Å, the tungsten film has a resistivity less than or equal to about 20 µΩ·cm or 25 µΩ·cm.

Next, at step 608, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas at 606. In embodiments where the inert gas is the same, the purge may be performed by diverting the first process gas from the process chamber, allowing the inert gas to flow through the process chamber, thereby purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of about 0 to about 10000 sccm to purge the process chamber. In spatial ALD, purge gas curtains are maintained between the flows of reactive gases and purging the process chamber may not be necessary. In some embodiment, however, the process chamber may be purged with an inert gas.

The flow of inert gas may facilitate removing any excess first process gas components and/or excess reaction byproducts from the process chamber to prevent unwanted gas phase reactions of the first and second process gases. For example, the flow of inert gas may remove excess tungsten-containing gas from the process chamber, thereby preventing a reaction between the tungsten precursor and a subsequent reactive gas.

Next, at step 610, the substrate is exposed to a second process gas for a second period of time. The second process gas reacts with the tungsten-containing compound on the substrate surface to create a deposited film. The second process gas can have an important impact on the resulting tungsten film. For example, when the second process gas is $H_2$, a tungsten film is deposited, but when the second reactive gas is silane or disilane, a tungsten silicide film is deposited.

In some embodiments, the second reactive gas comprises hydrogen and the resulting film formed is a tungsten film. The hydrogen gas may be supplied to the substrate surface at a flow rate greater than the tungsten-containing gas concentration. In one or more embodiments, the flow rate of $H_2$ is greater than about 1 time that of the tungsten-containing gas, or about 100 times that of the tungsten-containing gas, or in the range of about 3000 to 5000 times that of the tungsten-containing gas. The hydrogen gas can be supplied, in time-domain ALD, for a time in the range of about 1 sec to about 30 sec, or in the range of about 5 sec to about 20 sec, or in the range of about 10 sec to about 15 sec. The hydrogen gas can be supplied at a pressure in the range of about 1 Torr to about 30 Torr, or in the range of about 5 Torr to about 25 Torr, or in the range of about 10 Torr to about 20 Torr, or up to about 50 Torr. The substrate temperature can be maintained at any suitable temperature. In one or more embodiments, the substrate is maintained at a temperature less than about 475° C., or at a temperature about the same as that of the substrate during the tungsten-containing film deposition.

In some embodiments, conformal coverage of a feature is performed using short step times in both the pulse and purge steps, typically about 1-2 seconds. This time is sufficient for a reasonable adsorption of the precursor onto the substrate surface in the pulse step and for purging away the excess precursors or reduction gases from the gas delivery path as well as chamber cavity in the purge step. As used in this specification and the appended claims, the term "reasonable adsorption" is enough adsorption for a film to grow. In some embodiments, a tungsten film is grown at a rate less than or equal to about 0.9 Å/cycle, 0.8 Å/cycle, 0.7 Å/cycle, or 0.6 Å/cycle. Lower growth rates are good for conformal growth whereas higher growth rates (e.g., above about 1 Å/cycle) tend to grow non-conformal films. One or more embodiments, of the invention are directed to conformal tungsten films.

In some embodiments, the second reactive gas comprises hydrogen radicals. The hydrogen radicals can be generated by any suitable means including exposure of hydrogen gas to a "hot-wire". As used in this specification and the appended claims, the term "hot-wire" means any element that can be heated to a temperature sufficient to generate radicals in a gas flowing about the element. This is also referred to as a heating element.

Accordingly, one or more embodiments of the invention are directed to methods of processing a substrate or depositing a film. At least a portion of the substrate is sequentially exposed to a first reactive gas comprising a metal complex and a second reactive gas. The metal complex can be any suitable metal complex for ALD processing including, but not limited to, organometallic complexes. In some embodiments, the organometallic complex comprises a tungsten-containing compound. The tungsten-containing compound of some embodiments has the empirical formula $WCl_5$ (e.g., $WCl_5$, $W_2Cl_{10}$). In one or more embodiments, the tungsten-containing compound has the empirical formula $WCl_6$ (e.g., $WCl_6$, $W_2Cl_{12}$). The second reactive gas may comprise hydrogen radicals. The method of some embodiments is practices in a spatial atomic layer deposition chamber or by a spatial atomic layer deposition process. Spatial ALD may be particularly effective in the deposition of a tungsten film with hydrogen radicals because the device used to generate radicals (e.g., a hot wire) can be isolated from the metal organic precursors which are often incompatible with the hot wire material.

The second reactive gas (e.g., hydrogen), while passing the hot wire, or heating element, becomes radicalized. For example, $H_2$ passing a hot tungsten wire can result in the generation of H*. These hydrogen radicals are more reactive than ground state hydrogen atoms.

To be effective, the heating element must be heated to a temperature sufficient to create radicals. Heating can occur by, for example, passing sufficient electrical current through the heating element to elevate the temperature of the heating element.

Next, at 612, process chamber may be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, thereby purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of about 0 to about 10,000 sccm to purge the process chamber.

While the generic embodiment of the processing method shown in FIG. 1 includes only two pulses of reactive gases, it will be understood that this is merely exemplary and that additional pulses of reactive gases may be required. For example, a nitride film of some embodiments can be grown by a first pulse containing a precursor gas like tungsten pentachloride, a second pulse with a reducing agent followed by purging and a third pulse for nitridation. The pulses can be repeated in their entirety or in part. For example all three pulses could be repeated or only two can be repeated. This can be varied for each cycle as desired.

Next, at 614, it is determined whether the tungsten-containing layer has achieved a predetermined thickness. If the predetermined thickness has not been achieved, the method 600 returns to 604 to continue forming the tungsten-containing layer until the predetermined, or desired, thickness is reached. Once the predetermined thickness has been reached, the method 600 can either end or proceed to 116 where a bulk deposition process may be performed to deposit the remaining thickness of the tungsten-containing layer. In some embodiments, the bulk deposition process may be a CVD process. Upon completion of deposition of the tungsten-containing layer to a desired thickness, the method 600 generally ends and the substrate can proceed for any further processing. For example, in some embodiments, a CVD process may be performed to bulk deposit the tungsten-containing layer to a target thickness. For example in some embodiments, the tungsten-containing layer may be deposited via ALD or CVD reaction of the tungsten precursor and hydrogen radicals to form a total layer thickness of about 10 to about 10,000 Å, or in some embodiments, about 10 to about 1000 Å, or in some embodiments, about 500 to about 5,000 Å.

While the descriptions have generally referred to the tungsten-containing gas as the first gas, it will be understood by those skilled in the art that this is merely illustrative. In some embodiments, the substrate is first exposed to the second reactive gas followed by the tungsten-containing gas.

In any of the above embodiments, each cycle consisting of exposing the substrate to a first process gas, purging with an inert gas, exposing the substrate to a second process gas, and purging with an inert gas may form a tungsten-containing layer having a thickness of about 0.1 to about 1.5 Å on the substrate. In some embodiments, the thickness grows at a rate in the range of about 0.1 Å/cycle to about 5 Å/cycle, or in the range of about 0.2 Å/cycle to about 3 Å/cycle, or in the range of about 0.3 Å/cycle to about 2 Å/cycle. The sequence may be repeated until a desired total thickness of the tungsten-containing layer is achieved. For example, in some embodiments, the tungsten-containing layer may comprise a total thickness of about 2 Å to about 200 Å, or in some embodiments, about 50 Å. Accordingly, the deposition process may require up to about 2000 cycles to reach the desired thickness.

In any of the above embodiments, the flow rates and/or durations of each pulse may be the same or may vary over the course of the total cycles required to form a particular tungsten-containing layer, thereby facilitating layers having either uniform or graded compositions.

In some embodiments, the substrate surface is preconditioned. For example, if the surface of the substrate is an oxide, it may be desirable to perform a pre-soak using a hydride or hydride/hydrogen mixture. The hydride adsorbs and/or reacts with the substrate surface to form a conditioned surface, allowing for a uniform tungsten-containing layer to be formed. In some embodiments, the hydride may comprise silane ($Si_xH_y$) compounds (e.g., silane ($SiH_4$), disilane ($Si_2H_6$), trisilane ($Si_3H_8$), chlorosilane, dichlorosilane ($H_2SiCl_2$), or the like), borane ($B_xH_y$) compounds (e.g., diborane ($B_2H_6$), triborane ($B_3H_8$), pentaborane ($B_5H_9$), or the like), phosphine ($PH_3$), derivatives thereof, combinations thereof, or the like. In addition, in some embodiments, the hydride may be diluted in a dilutant gas, for example an inert gas, such as argon (Ar), helium (He), nitrogen ($N_2$), hydrogen ($H_2$), or the like. For example, in such embodiments, the hydride may be provided in a mixture of about 5% hydride to about 95% diluent gas by volume. In some embodiments, for example where the hydride comprises diborane, the flow rate of the hydride may be about 1 to about 75 sccm.

In an embodiment, a tungsten film may be formed by placing a substrate with 10 Å or more of a metallic layer, such as ALD TiN, TiSiN, TiAl, PVD Ti, TiN, or, if an oxide, soak with either disilane or a mixture of hydrogen and silane at 5 to 20 Torr partial pressure on a pedestal held at a temperature in the range of about 400 to about 475° C. A tungsten-containing compound (e.g., $WCl_6$ or $WCl_6$) can be pulsed with a mixture of argon to the wafer surface at 5 to 20 Torr followed by purging with argon (or another inert gas). Argon pressure is increased to about 20 Torr and then hydrogen pulsing is started. The hydrogen radical pulsing may be done at high flow so that the ratio of hydrogen to tungsten-containing compound is in the range of about 3000 to 5000, for about 10 to 15 seconds. The chamber is purged with argon (or another inert gas) for 5 to 10 seconds. The cycle is repeated until the growth of the tungsten film reaches a designated thickness.

Some embodiments of the invention are directed to tungsten containing films. These film include, tungsten metal films, tungsten nitrides, silicide and tungsten silicon nitride. The tungsten containing films can be used for any number of suitable purposes including, but not limited to, p-metal work function layers and fill materials.

Accordingly, some embodiments of the invention are directed to fluorine-free tungsten films used as the p-metal work function layer to manufacture metal gates in field effect transistor (FET) devices, in both logic and memory applications. The film grown by the described processes has significant benefits including a significantly lower resistivity and higher thermal stability (can be annealed up to 1000° C.) than other films currently used as a gate metal. The thermal stability is especially important for VNAND and BWL in memory applications. One or more embodiments of the invention are directed to tungsten films having a work function greater than about 4.6 eV or about 4.7 eV, or about 4.8 eV. The work function metal can be deposited on a gate oxide of the FET. The work function metal controls the threshold value for current flow. A low threshold value requires less energy usage so a more conductive metal is better. Tungsten films deposited by known processes results in a film typically with a work function of about 4.45 eV.

Some embodiments of the invention are directed to integrated circuit transistor devices comprising a dielectric layer disposed over a channel. A work function metal is disposed over the dielectric layer and a fill layer consisting essentially of tungsten is deposited over the work function layer. As used in this specification and the appended claims, the term "consisting essentially of tungsten" used in this regard means that the fill layer is greater than about 95%, 98% or 99% tungsten. The work function layer of some embodiments comprises one or more of Ti and TiAl. In one or more embodiments, the work function metal contains substantially no fluorine. In some embodiments, the fill layer contains substantially no fluorine. As used in this specification and the appended claims, the term "substantially no fluorine" means that there is less than about 5%, 4%, 3%, 2%, 1%, 0.5% or 0.1% fluorine in the film on an atomic basis. In some embodiments, there is no intervening layer between the work function metal and the film consisting essentially of tungsten.

In one or more embodiments, there is an intervening layer between the work function metal and the film consisting essentially of tungsten. The intervening layer can have any suitable thickness depending on the intended use of the integrated circuit transistor. In some embodiments, the intervening layer has a thickness less than about 7 Å, 6 Å, 5 Å, 4 Å or 3 Å.

In some embodiments, the tungsten containing film is used as a low resistivity fill material. To achieve a complete seamless fill, a periodic treatment (e.g., after every 10 to 30 Å film) is applied. The method of the treatment includes (a) alternating exposure to $TiCl_4$ and ammonia; (b) performing a $TiCl_4$ soak or (c) hydrogen direct or remote plasma exposure for 10 to 30 seconds. The treatment can be performed at the same temperature as the deposition process. The processes described will deposit about 0.7 Å TiN (less than 1 Å TiN) to refresh the surface and remove extra chloride during deposition. The amount of TiN deposited in these embodiments is less than about ½ a monolayer or in the range of about ⅓ to about ⅕ of a monolayer of TiN.

It has been found that the various tungsten films described can be useful for, for example, (1) nucleation and film growth repeatability using a silane soak; (2) adhesions on oxides by growing an initial one or two layers of tungsten silicide; (3) reducing roughness by soaking in ammonia, followed by soaking in silane (to increase nucleation density) (4) by $TiCl_4/NH_3$ cycles (on oxide or oxidized surface) to deposit less than about 1 Å TiN at the interface; and (5) integration of thin TiN, to provide good nucleation, adhesion and conformality (deposited by any suitable method and reagents).

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method comprising:
   exposing a substrate surface to a first process condition comprising a first reactive gas and a second reactive gas;
   laterally moving the substrate surface through a gas curtain from the first process condition to a second process condition; and
   exposing the substrate surface to the second process condition comprising the second reactive gas,
   wherein the first process condition comprises less than a full amount of the second reactive gas for CVD, wherein the gas curtain comprises one or more of a purge gas stream and/or a vacuum region.

2. The method of claim 1, wherein the first reactive gas comprises $WF_6$.

3. The method of claim 2, wherein the second reactive gas comprises $H_2$.

4. The method of claim 1, wherein the second reactive gas is pulsed into the first reactive gas in the first process condition.

5. The method of claim 1, wherein the second reactive gas is continuously flowed into the first reactive gas in the first process condition.

6. The method of claim 1, wherein the first reactive gas and the second reactive gas in the first process condition are mixed prior to flowing into a process region of a processing chamber.

7. The method of claim 1, wherein the second reactive gas comprises in the range of about 1 to about 10% of the first reactive gas in the first process condition.

8. The method of claim 1, wherein a film is deposited with a deposition rate in the range of about 0.2 to about 1 Å/cycle.

9. The method of claim 1, further comprising repeated exposure to the first process condition and the second process condition.

10. A method comprising:
    exposing a substrate surface to a first process condition comprising a first reactive gas and a second reactive gas, the first reactive gas and the second reactive gas being spontaneously reactive;
    laterally moving the substrate surface through a gas curtain from the first process condition to a second process condition; and
    exposing the substrate surface to the second process condition consisting essentially of the second reactive gas,
    wherein the first process condition comprises less than a full amount of the second reactive gas for CVD, wherein the gas curtain comprises one or more of a purge gas stream and/or a vacuum region.

11. The method of claim 10, wherein the first reactive gas comprises $WF_6$.

12. The method of claim 11, wherein the second reactive gas consists essentially of $H_2$.

13. The method of claim 10, wherein the second reactive gas is pulsed into the first reactive gas in the first process condition.

14. The method of claim 10, wherein the second reactive gas is continuously flowed into the first reactive gas in the first process condition.

15. The method of claim 10, wherein the first reactive gas and the second reactive gas in the first process condition are mixed prior to flowing into a process region of a processing chamber.

16. The method of claim 10, wherein the second reactive gas comprises in the range of about 1 to about 10% of the first reactive gas in the first process condition.

17. The method of claim 10, wherein a film is deposited with a deposition rate in the range of about 0.2 to about 1 Å/cycle.

18. The method of claim 10, further comprising repeated exposure to the first process condition and the second process condition.

19. A method comprising:
    exposing a substrate surface to a first process condition in a first process region of a processing chamber, the first process condition comprising a constant flow of a first reactive gas comprising $WF_6$ and a pulsed flow of a second reactive gas consisting essentially of $H_2$, the second reactive gas pulsed so that there is less than a full amount of the second reactive gas for CVD;
    laterally moving the substrate surface through a gas curtain from the first process region to a second process region of the processing chamber, the gas curtain comprising one or more of a purge gas stream and/or a vacuum region;
    exposing the substrate surface to a second process condition in the second process region, the second process condition consisting essentially of the $H_2$;
    laterally moving the substrate surface through a gas curtain from the second process region, the gas curtain comprising one or more of a purge gas stream and/or a vacuum region; and
    repeating exposures to the first process condition and the second process condition to deposit a film of a predetermined thickness.

* * * * *